(12) United States Patent
Wang (10) Patent No.: US 11,522,101 B2
(45) Date of Patent: Dec. 6, 2022

(54) INORGANIC LIGHT-EMITTING DIODE CHIP, METHOD FOR PREPARING THE SAME, AND DISPLAY SUBSTRATE

(71) Applicant: BOE TECHNOLOGY GROUP CO., LTD., Beijing (CN)

(72) Inventor: Guoqiang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 232 days.

(21) Appl. No.: 16/767,050

(22) PCT Filed: Dec. 13, 2019

(86) PCT No.: PCT/CN2019/125106
§ 371 (c)(1),
(2) Date: May 26, 2020

(87) PCT Pub. No.: WO2020/181859
PCT Pub. Date: Sep. 17, 2020

(65) Prior Publication Data
US 2021/0074882 A1 Mar. 11, 2021

(30) Foreign Application Priority Data

Mar. 13, 2019 (CN) .......................... 201910188660.X (51) Int. Cl.
*H01L 33/08* (2010.01)
*H01L 33/06* (2010.01)
(Continued)

(52) U.S. Cl.
CPC .......... *H01L 33/08* (2013.01); *H01L 33/0075* (2013.01); *H01L 33/06* (2013.01);
(Continued)

(58) Field of Classification Search
CPC ... H01L 33/42; H01L 27/153; H01L 33/0075; H01L 33/08; H01L 33/32; H01L 33/36;
(Continued)

(56) References Cited

U.S. PATENT DOCUMENTS

2011/0220945 A1 9/2011 Kang et al.
2013/0277692 A1 10/2013 Chang et al.
(Continued)

FOREIGN PATENT DOCUMENTS

CN 102194952 A 9/2011
CN 103456851 A 12/2013
(Continued)

OTHER PUBLICATIONS

US 11,257,798 B2, 02/2022, Chae et al. (withdrawn)*
(Continued)

*Primary Examiner* — Savitri Mulpuri
(74) *Attorney, Agent, or Firm* — Muncy, Geissler, Olds & Lowe, P.C.

(57) ABSTRACT

The present disclosure provides an inorganic light-emitting diode chip, a method for preparing the same, and a display substrate. The inorganic light-emitting diode chip includes: an undoped gallium nitride layer and a light-emitting unit arranged on the undoped gallium nitride layer, the light-emitting unit includes a first light-emitting subunit including a first N-type gallium nitride layer, a first multi-quantum well layer and a first P-type gallium nitride layer that are sequentially arranged, and a second light-emitting subunit including a second P-type gallium nitride layer, a second multi-quantum well layer and a second N-type gallium nitride layer that are sequentially arranged on a surface of the first P-type gallium nitride layer; an orthogonal projection of the second multi-quantum well layer on the undoped gallium nitride layer is smaller than an orthogonal projection
(Continued)

of the first multi-quantum well layer on the undoped gallium nitride layer.

14 Claims, 5 Drawing Sheets

(51) Int. Cl.
  *H01L 33/32* (2010.01)
  *H01L 33/42* (2010.01)
  *H01L 33/00* (2010.01)
  *H01L 33/44* (2010.01)
(52) U.S. Cl.
  CPC .............. *H01L 33/32* (2013.01); *H01L 33/42* (2013.01); *H01L 33/44* (2013.01); *H01L 2933/0016* (2013.01); *H01L 2933/0025* (2013.01); *H01L 2933/0066* (2013.01)
(58) Field of Classification Search
  CPC ............. H01L 33/44; H01L 2933/0066; H01L 2933/0016; H01L 33/007; H01L 2933/0025; H01L 33/025
  See application file for complete search history.

(56) References Cited

U.S. PATENT DOCUMENTS

2019/0019837 A1   1/2019   Tian et al.
2019/0019839 A1   1/2019   Tian et al.

FOREIGN PATENT DOCUMENTS

CN    106328787 A    1/2017
CN    107256862 A    10/2017
CN    109920891 A    6/2019

OTHER PUBLICATIONS

Office Action of CN Application No. 201910188660.X and English translation, dated Nov. 29, 2019, 14 pages.
International Search Report of PCT/CN2019/125106 and English translation, dated Mar. 12, 2020, 15 pages.

* cited by examiner

INORGANIC LIGHT-EMITTING DIODE CHIP, METHOD FOR PREPARING THE SAME, AND DISPLAY SUBSTRATE

CROSS-REFERENCE TO RELATED APPLICATIONS

This application is the U.S. national phase of PCT Application No. PCT/CN2019/125106 filed on Dec. 13, 2019, which claims a priority to Chinese Patent Application No. 201910188660.X filed on Mar. 13, 2019, the disclosures of which are incorporated in their entirety by reference herein.

TECHNICAL FIELD

The present disclosure relates to the field of display, and in particular to an inorganic light-emitting diode chip, a method for preparing the same, and a display substrate.

BACKGROUND

For the micro-inorganic light-emitting diode manufacturing process, three kinds of inorganic light-emitting diode chips emitting red light, green light and blue light are prepared firstly, and then the inorganic light-emitting diode chip having different emitting colors are transferred to the array substrate. The micro-inorganic light-emitting diode chip needs to be transferred multiple times, and the amount of the chip transferred is very large each time, which requires very high stability and accuracy of the transferring process.

SUMMARY

The present disclosure provides an inorganic light-emitting diode chip, including: an undoped gallium nitride layer and a light-emitting unit arranged on the undoped gallium nitride layer, in which the light-emitting unit includes a first light-emitting subunit and a second light-emitting subunit, the first light-emitting subunit includes a first N-type gallium nitride layer, a first multi-quantum well layer and a first P-type gallium nitride layer that are sequentially arranged, and the second light-emitting subunit includes a second P-type gallium nitride layer, a second multi-quantum well layer and a second N-type gallium nitride layer that are sequentially arranged on a surface of the first P-type gallium nitride layer; an orthogonal projection of the second multi-quantum well layer on the undoped gallium nitride layer is smaller than an orthogonal projection of the first multi-quantum well layer on the undoped gallium nitride layer; and a color of a light beam emitted by the second multi-quantum well layer is different from a color of a light beam emitted by the first multi-quantum well layer.

In one example, the second P-type gallium nitride layer is arranged between the first P-type gallium nitride layer and the second multi-quantum well layer, and the second multi-quantum well layer completely covers the second P-type gallium nitride layer.

In one example, the first multi-quantum well layer is a green light multi-quantum well layer, and the second multi-quantum well layer is a blue light multi-quantum well layer; or the first multi-quantum well layer is a blue light multi-quantum well layer, and the second multi-quantum well layer is a green light multi-quantum well layer.

In one example, a doping concentration of indium in the green light multi-quantum well layer is $4\times10^{18}/cm^3$ to $4.3\times10^{18}/cm^3$, and a doping concentration of indium in the blue light multi-quantum well layer is $3.0\times10^{18}/cm^3$ to $3.5\times10^{18}/cm^3$.

In one example, a transparent electrode is arranged on the second N-type gallium nitride layer and on a portion of a surface of the first P-type gallium nitride layer not covered by the second multi-quantum well layer, and the transparent electrode extends to the non-light-emitting region, and a welding point is arranged on the transparent electrode in the non-light-emitting region.

In one example, the first N-type gallium nitride layer includes a region covered by the first multi-quantum well layer and an uncovered region, and a transparent electrode is arranged on the uncovered region, and the transparent electrode extends to the non-light-emitting region, and a welding point is arranged on the transparent electrode in the non-light-emitting region.

In one example, a silicon nitride layer is arranged between the transparent electrode and the welding point.

In one example, an area of the orthogonal projection of the second multi-quantum well layer on the undoped gallium nitride layer accounts for 40% to 60% of an area of the orthogonal projection of the first multi-quantum well layer on the undoped gallium nitride layer.

In one example, a thickness of the first multi-quantum well layer is 5 nm to 20 nm, and a thickness of the second multi-quantum well layer is 5 nm to 20 nm.

The present disclosure provides a method for preparing an inorganic light-emitting diode chip, including: forming an undoped gallium nitride layer; sequentially forming a first N-type gallium nitride layer, a first multi-quantum well layer and a first P-type gallium nitride layer on the undoped gallium nitride layer; etching the first N-type gallium nitride layer, the first multi-quantum well layer and the first P-type gallium nitride layer to form a first light-emitting subunit; sequentially forming a second P-type gallium nitride layer and a second multi-quantum well layer on a surface of the first P-type gallium nitride layer, in which a color of a light beam emitted by the second multi-quantum well layer is different from a color of a light beam emitted by the first multi-quantum well layer, and an orthogonal projection of the second multi-quantum well layer on the undoped gallium nitride layer is smaller than an orthogonal projection of the first multi-quantum well layer on the undoped gallium nitride layer; forming a second N-type gallium nitride layer on a surface of the second multi-quantum well layer; and etching the second multi-quantum well layer and the second N-type gallium nitride layer to form a second light-emitting subunit.

In one example, the method further includes: after forming the first light-emitting subunit, depositing a silicon dioxide layer on the surface of the first P-type gallium nitride layer, etching the silicon dioxide layer to remove the silicon dioxide layer in a first region, so as to expose the first P-type gallium nitride layer in the first region, and forming the second multi-quantum well layer in the first region.

In one example, forming the second multi-quantum well layer at the growth site includes: forming a second P-type gallium nitride layer in the first region; and forming a second multi-quantum well layer on a surface of the second P-type gallium nitride layer.

In one example, the method further includes: after forming the second light-emitting subunit, removing the silicon dioxide layer located outside the first region, and forming a transparent electrode on an exposed surface of the first P-type gallium nitride layer, in which the transparent electrode extends to a non-light-emitting region, and forming a welding point on the transparent electrode in the non-light-emitting region.

In one example, the method further includes: after forming the second light-emitting subunit, forming a transparent electrode on a surface of a region of the first N-type gallium nitride layer not covered by the first multi-quantum well layer and a surface of the second N-type gallium nitride layer; in which the transparent electrode extends to a non-light-emitting region, and forming a welding point on the transparent electrode in the non-light-emitting region.

In one example, the forming the welding point on the transparent electrode in the non-light-emitting region includes: forming a silicon nitride layer on the transparent electrode in the non-light-emitting region; and forming the welding point on the silicon nitride layer.

The present disclosure also provides a display substrate, including a backplane and the inorganic light-emitting diode chip described in the above technical solution.

DETAILED DESCRIPTION

In order to better understand the present disclosure, the specific embodiments of the present disclosure will be described below in combination with Examples, but it should be understood that these descriptions are merely used to further illustrate the features and advantages of the present disclosure and are not intended to limit the present disclosure.

Micro-inorganic light-emitting diode (Micro-LED) refers to a high-density micro-sized LED array integrated on a chip. Each pixel is addressed, driven separately, and has self-luminous properties. As compared with liquid crystal display (LCD) display technology and LED display technology using LED backlight backplanes, micro-inorganic light-emitting diodes have the characteristics of high luminous efficiency, high brightness, low power consumption, no image imprinting, fast response speed and long life.

The essence of micro-inorganic light-emitting diodes is to miniaturize and array LEDs, and then transfer a large number of micro-LEDs to the circuit substrate. The core technical difficulty is to transfer the large number of micro-LEDs to the substrate, and after the transferring, the LED should be uniform so as to achieve the desired effect of luminous display.

Figure 1:
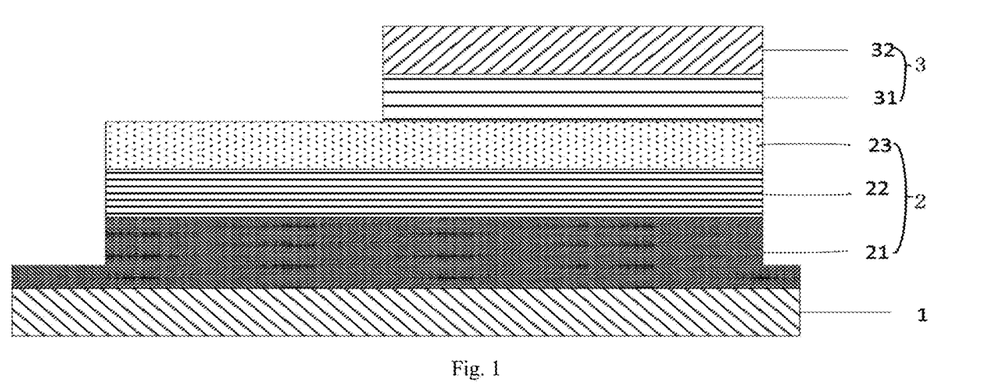
FIG. 1 is a schematic view showing a sectional structure of an inorganic light-emitting diode chip according to an embodiment of the present disclosure.

An embodiment of the present disclosure discloses an inorganic light-emitting diode chip, see FIG. 1, including: an undoped gallium nitride layer 1, and a first light-emitting subunit 2 and a second light-emitting subunit 3 arranged on the undoped gallium nitride layer 1, the first light-emitting subunit 2 including a first N-type gallium nitride layer 21, a first multi-quantum well layer 22 and a first P-type gallium nitride layer 23 that are sequentially arranged, and the second light-emitting subunit 3 including a second multi-quantum well layer 31 and a second N-type gallium nitride layer 32 that are sequentially arranged on a surface of the first P-type gallium nitride layer 23.

An orthogonal projection of the second multi-quantum well layer 31 on the undoped gallium nitride layer 1 is smaller than an orthogonal projection of the first multi-quantum well layer 22 on the undoped gallium nitride layer 1.

A color of a light beam emitted by the second multi-quantum well layer 31 is different from a color of a light beam emitted by the first multi-quantum well layer 22.

The present disclosure comprehensively considers the light-emitting characteristics of the inorganic light-emitting diode chip and the requirements of the multi-quantum well for the growth substrate, and realizes that the two light-emitting units share the anode.

According to the present disclosure, an inorganic light-emitting diode chip includes: an undoped gallium nitride layer and a light-emitting unit arranged on the undoped gallium nitride layer.

In one example, the inorganic light-emitting diode chip is arranged on a sapphire substrate.

The sapphire substrate used as a base has the following characteristics:

1. Sapphire has the same hexagonal symmetry as wurtzite group III nitride, with lattice constants of a=0.4758 nm and c=1.2991 nm, which match the crystal structure and lattice constant of N-type gallium nitride. The green light multi-quantum well or blue light multi-quantum well can be grown by adjusting the content of indium in the multi-quantum well.

2. The melting point of sapphire is 2042° C., and the thermal conductivity C' is 25.12 W.m-1.K-1. The thermal shock coefficient is 790 W.m-1, and the thermal expansion coefficient is 5.8×10-6/K, which are close to those of N-type gallium nitride.

3. The hardness of sapphire is grade 9, which is a very important and frequently used substrate material in microelectronics research. Its preparation process is mature, the price is low, it is easy to be cleaned and handled, and it has good stability at high temperature, thereby achieving large-scale stable production.

In one example, an undoped gallium nitride layer is arranged on the sapphire substrate, and the function of the undoped gallium nitride layer is to make the crystal form of the first N-type gallium nitride layer better match the sapphire substrate.

According to the present disclosure, the light-emitting unit may emit light of two colors. In one example, blue light or green light may be emitted.

The light-emitting unit includes a first light-emitting subunit 2 and a second light-emitting subunit 3, the first light-emitting subunit 2 includes a first N-type gallium nitride layer 21, a first multi-quantum well layer 22 and a first P-type gallium nitride layer 23 that are sequentially arranged, and the second light-emitting subunit 3 includes a second multi-quantum well layer 31 and a second N-type gallium nitride layer 32 that are sequentially arranged on a surface of the first P-type gallium nitride layer 23.

Figure 2:
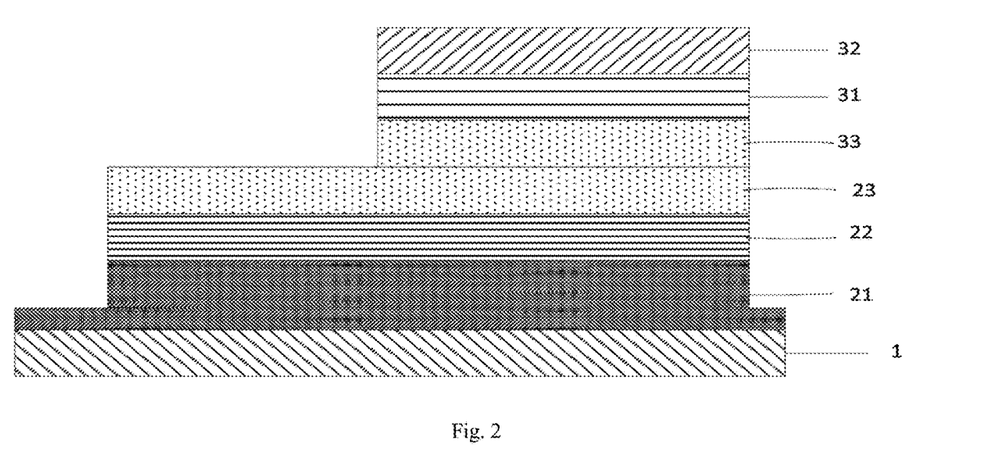
FIG. 2 is a schematic view showing a sectional structure of an inorganic light-emitting diode chip according to another embodiment of the present disclosure.

In one example, the second light-emitting subunit 3 further includes a second P-type gallium nitride layer 33 arranged between the first P-type gallium nitride layer 23 and the second multi-quantum well layer 31. The second multi-quantum well layer 31 completely covers the second P-type gallium nitride layer 33. The arrangement of the second P-type gallium nitride layer 33 can cover the defects in the first P-type gallium nitride layer 23 to ensure the luminous efficiency of the second multi-quantum well layer 31. See FIG. 2 for details.

The first P-type gallium nitride layer can be well matched with the lattice of the second P-type gallium nitride layer so as to grow a second multi-quantum well.

According to the present disclosure, an orthogonal projection of the second multi-quantum well layer on the undoped gallium nitride layer is smaller than an orthogonal projection of the first multi-quantum well layer on the undoped gallium nitride layer.

According to the present disclosure, a color of a light beam emitted by the second multi-quantum well layer is different from a color of a light beam emitted by the first multi-quantum well layer.

In one example, the first quantum well layer and the second quantum well layer are any one of a blue multi-quantum well layer and a green multi-quantum well layer, respectively, and their emitting colors are different.

When the first multi-quantum well layer is a green light multi-quantum well layer, the second multi-quantum well layer is a blue light multi-quantum well layer.

When the first multi-quantum well layer is a blue multi-quantum well layer, the second multi-quantum well layer is a green multi-quantum well layer.

The thickness of the first multi-quantum well layer can be selected to be 5 nm to 20 nm, and the luminous efficiency is different for different thicknesses. The well layer and the barrier layer are alternately arranged, and the period is greater than 2.

The thickness of the second multi-quantum well layer can be selected to be 5 nm to 20 nm, and the luminous efficiency is different for different thicknesses. The well layer and the barrier layer are alternately arranged, and the period is greater than 2.

The doping concentration of In in the green multi-quantum well layer is $4\times10^{18}$/cm to $4.3\times10^{18}$/cm. The doping concentration of In in the blue multi-quantum well layer is $3.0\times10^{18}$/cm to $3.5\times10^{18}$/cm.

Figure 3:
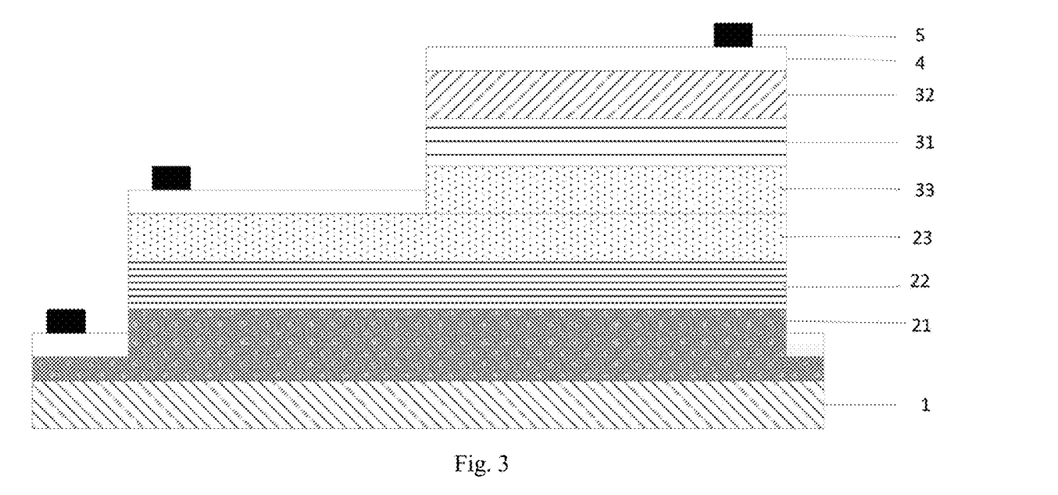
FIG. 3 is a schematic view showing a sectional structure of an inorganic light-emitting diode chip according to a yet embodiment of the present disclosure.

In order to ensure that both green light and blue light achieve the best luminous efficiency, in one example, an area of the orthogonal projection of the second multi-quantum well layer on the undoped gallium nitride layer accounts for 40% to 60% of an area of the orthogonal projection of the first multi-quantum well layer on the undoped gallium nitride layer. In one example, a transparent electrode 4 is arranged on the second N-type gallium nitride layer, and is arranged on a portion of a surface of the first P-type gallium nitride layer 23 not covered by the second multi-quantum well layer.

Figure 4:
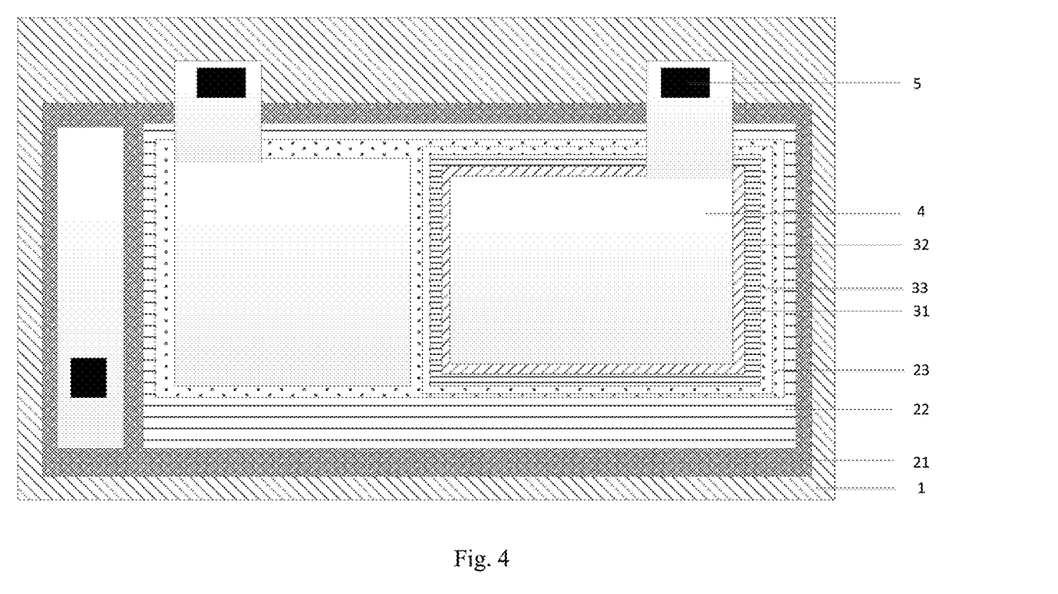
FIG. 4 is a top view showing an inorganic light-emitting diode chip according to an embodiment of the present disclosure.

The transparent electrode 4 extends to a non-light-emitting region, and a welding point 5 is arranged on the transparent electrode located in the non-light-emitting region. See FIG. 3 and FIG. 4 for details. In FIG. 4, in order to indicate the sequence of each film layer, each film layer shrinks from bottom to top. In practice, the contour of the vertical projection of each film layer on the substrate can be basically the same.

In one example, the first N-type gallium nitride layer includes a region covered by the first multi-quantum well layer and an uncovered region, and a transparent electrode is arranged on the uncovered region.

The transparent electrode extends to a non-light-emitting region, and a welding point is arranged on the transparent electrode located in the non-light emitting region. Since the welding point is usually made of solder balls or solder paste or conductive glue, which is basically opaque, arranging it in the non-light-emitting region can minimize the impact on the light-emitting region. The non-light-emitting region refers to any region whose orthogonal projection does not overlap with the orthogonal projection regions of the first multi-quantum well layer and the second multi-quantum well layer on the substrate in a direction perpendicular to the substrate.

The function of the transparent electrode is to provide an appropriate platform during the preparation of the subsequent welding point, and connect the cathode and the anode of the inorganic light-emitting diode to reduce the contact resistance.

The transparent electrode may be an ITO electrode.

In one example, a silicon nitride layer is arranged between the transparent electrode and the welding point. The silicon nitride layer is beneficial to increase light extraction efficiency.

The material of the welding point may be a tin-containing alloy. The tin-containing alloy has a specific melting point and resistance to meet different welding requirements.

As compared with the related art, the present disclosure realizes that one inorganic light-emitting diode chip can emit light of two colors by sharing an anode. The occupied area of the two light-emitting units is minimized, and the manufacturing process of the inorganic light-emitting diode chip is simplified. In the subsequent massive transfer process, the two light-emitting units are transferred together to reduce the number of failed chips due to the excessive number of transfer and to improve the success rate of transfer.

The embodiments of the present disclosure disclose a method for preparing an inorganic light-emitting diode chip, including: providing a substrate; forming an undoped gallium nitride layer on the substrate; sequentially forming a first N-type gallium nitride layer, a first multi-quantum well layer and a first P-type gallium nitride layer on the undoped gallium nitride layer; etching the first N-type gallium nitride layer, the first multi-quantum well layer and the first P-type gallium nitride layer to form a first light-emitting subunit; depositing a silicon dioxide layer on a surface of the first P-type gallium nitride layer, performing an etching process to remove a silicon dioxide layer in a first region so as to expose the first P-type gallium nitride layer in the first region; forming the second multi-quantum well layer in the first region, in which a color of a light beam emitted by the second multi-quantum well layer is different from a color of a light beam emitted by the first multi-quantum well layer; forming a second N-type gallium nitride layer on a surface of the second multi-quantum well layer; etching the second multi-quantum well layer and the second N-type gallium nitride layer to form a second light-emitting subunit; removing a silicon dioxide layer located outside the first region to expose the first P-type gallium nitride layer; and peeling the substrate.

The method for preparing the inorganic light-emitting diode chip is described in detail below according to specific steps.

S1: providing a substrate.

The substrate is used to support the inorganic light-emitting diode chip, and it is convenient to transfer it. The substrate may be a sapphire substrate 6.

S2: forming an undoped gallium nitride layer on the substrate.

Regarding the selection and formation method of the substrate and the undoped gallium nitride layer, please follow the related technologies.

S3: sequentially forming a first N-type gallium nitride layer 21, a first multi-quantum well layer 22 and a first P-type gallium nitride layer 23 on the undoped gallium nitride layer. See FIG. 5 for details of the structure formed.

Figure 5:
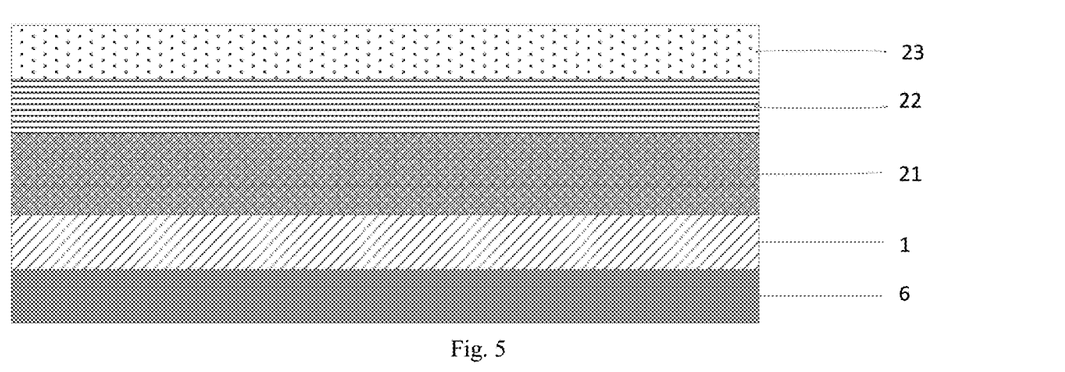
FIGS. 5 to 11 are schematic views showing of structures of an inorganic light-emitting diode chip in the preparation process according to the present disclosure.

The first N-type gallium nitride layer 21 is doped with silicon to form an N-type gallium nitride.

A first multi-quantum well layer 22 is formed on the first N-type gallium nitride layer 21, for example, a continuous growth is performed to ensure the continuity of the quantum well. The first multi-quantum well layer 22 may be a blue multi-quantum well layer or a green multi-quantum well layer, for example, a green multi-quantum well layer.

A first P-type gallium nitride layer 23 is formed on the first multi-quantum well layer 22. The first P-type gallium nitride layer 23 is doped with indium to form a P-type gallium nitride. The method for forming the P-type gallium nitride is the same as the method for forming the N-type gallium nitride.

S4: etching the first N-type gallium nitride layer 21, the first multi-quantum well layer 22 and the first P-type gallium nitride layer 23 to form a first light-emitting subunit. See FIG. 6 for details of the structure formed.

Figure 6:
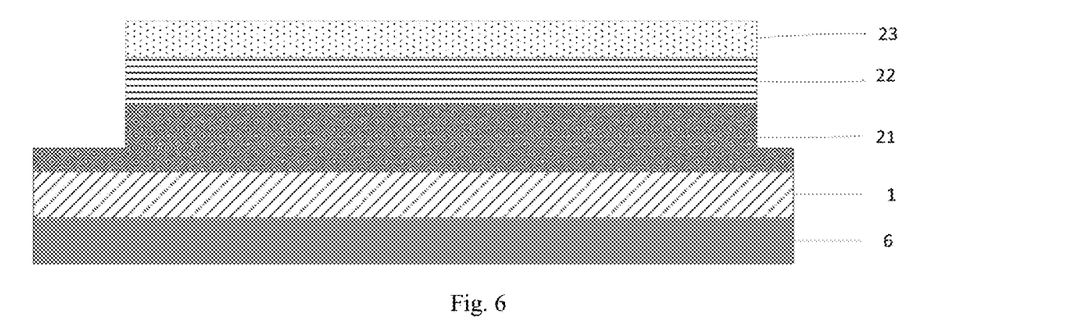

The step S4 is used to isolate a specific region to form an individual first light-emitting subunit. The area of the first light-emitting subunit can be adjusted appropriately, and can be selected from 1 um$^2$ to 20 um$^2$.

After the etching the first N-type gallium nitride layer 21, the first multi-quantum well layer 22, and the first P-type gallium nitride layer 23, the uncovered region of the first N-type gallium nitride layer 21 is exposed.

S5: depositing a silicon dioxide layer on a surface of the first P-type gallium nitride layer 23, performing an etching process to remove the silicon dioxide layer 7 located in a first region 8, so as to expose the first P-type gallium nitride layer 23 in the first region. See FIG. 7 for details.

Figure 7:
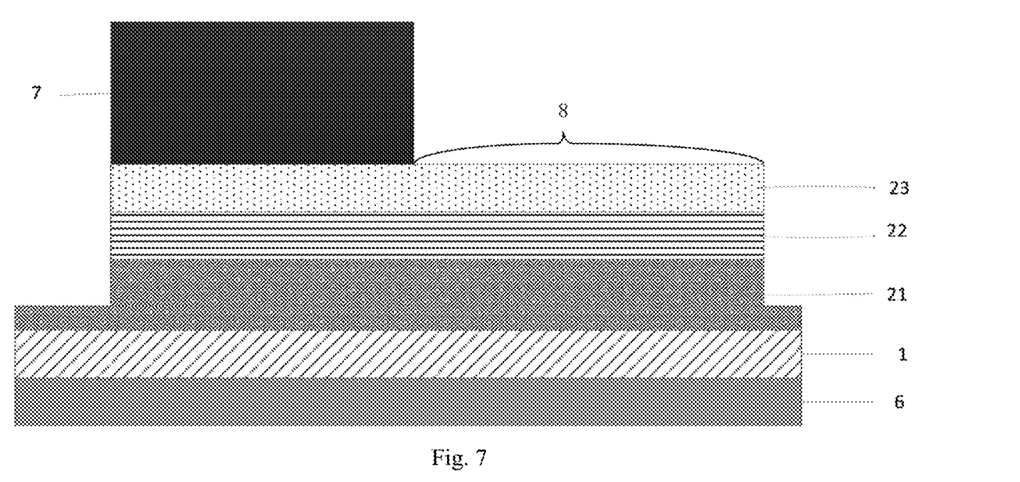

The function of depositing the silicon dioxide layer 7 is to form and expose the growth site of the second multi-quantum well layer. Since the second multi-quantum well layer is only arranged in a part of the region on the surface of the first P-type gallium nitride layer, after the etching process, the silicon dioxide layer in the first region is removed to expose the first P-type gallium nitride layer located in the first region, and the exposed first P-type gallium nitride layer located in the first region is the growth site of the second multi-quantum well layer.

In order to ensure that the first multi-quantum well layer and the second multi-quantum well layer have high luminous effects at the same time, in one example, the silicon dioxide layer located in the first region is located on one side of the entire silicon dioxide layer, and the area of the silicon dioxide layer located in the first region is 40% to 60% of the area of the entire silicon dioxide layer. Optionally, the silicon dioxide layer located in the first region is located in the center of the entire silicon dioxide layer.

S6: forming the second multi-quantum well layer in the first region, in which a color of a light beam emitted by the second multi-quantum well layer is different from a color of a light beam emitted by the first multi-quantum well layer.

In the first region, the second multi-quantum well layer can be directly formed by hydride vapor phase epitaxy (HVPE), gas source molecular beam epitaxy (GSMBE), metal organic chemical vapor deposition (MOCVD), etc.

In one example, the second multi-quantum well layer is a blue multi-quantum well layer or a green multi-quantum well layer. For example, when the first multi-quantum well layer is a green light multi-quantum well layer, the second multi-quantum well layer is a blue light multi-quantum well layer.

In step S5, the etching process will form defects on the surface of the first P-type gallium nitride layer, thereby affecting the luminous effect of the second multi-quantum well layer.

Therefore, in an example, the step S6 includes: forming a second P-type gallium nitride layer 33 in the first region; and forming a second multi-quantum well layer 31 on a surface of the second P-type gallium nitride layer 33.

The thickness of the second P-type gallium nitride layer 33 may be from 1 nm to 10 nm.

S7: forming a second N-type gallium nitride layer 32 on a surface of the second multi-quantum well layer 31.

The thickness of the second N-type gallium nitride layer 32 may be from 1 nm to 10 nm.

S8: etching the second multi-quantum well layer and the second N-type gallium nitride layer to form a second light-emitting subunit.

Figure 8:
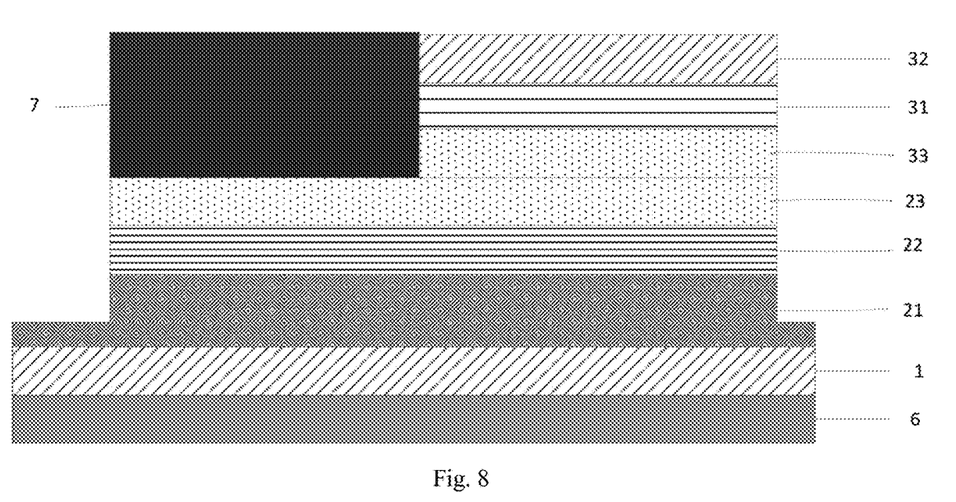

In one example, the second multi-quantum well layer and the second N-type gallium nitride layer is etched through metal organic chemical vapor deposition (MOCVD) to form a second light-emitting subunit. See FIG. 8 for the details of the structure formed in steps S6 to S8.

Figure 9:
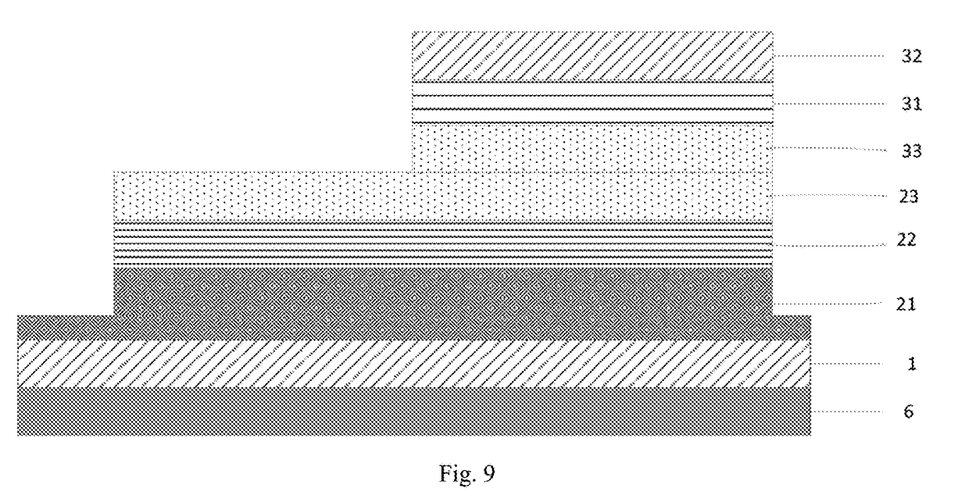

S9: removing a silicon dioxide layer located outside the first region to expose a portion of the first P-type gallium nitride layer 23. See FIG. 9 for details of the structure formed.

The method for removing the silicon dioxide layer may be dry etching or wet etching. The dry etching may be plasma etching. The wet etching may use hydrofluoric acid immersion.

Figure 10:
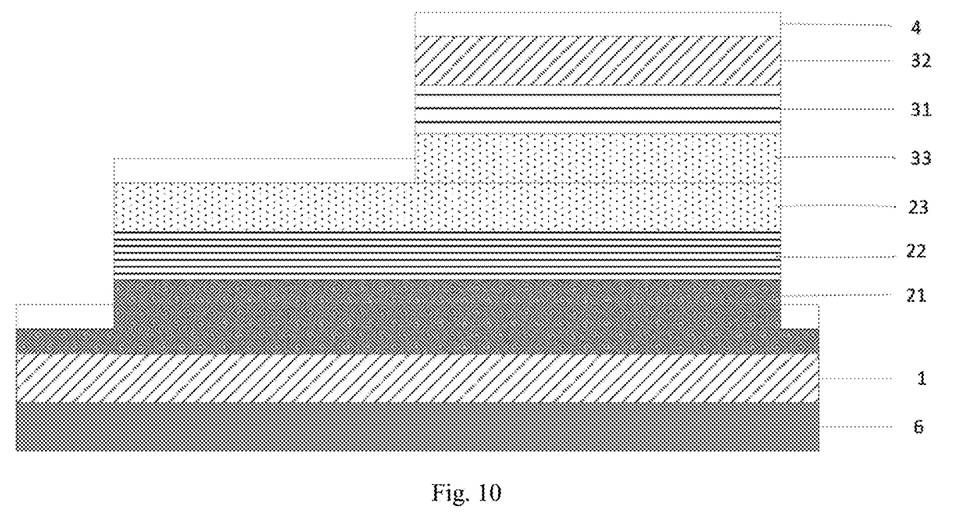

In one example, after removing the silicon dioxide layer, the method further includes: forming a transparent electrode 4 on the surface of the exposed first P-type gallium nitride layer 23, and the formed structure is shown in FIG. 10.

In one example, after the forming the second light-emitting subunit and the removing the silicon dioxide layer, the method further includes: after the forming the second light-emitting subunit, forming a transparent electrode 4 on a surface of a region of the first N-type gallium nitride layer 21 not covered by the first multi-quantum well layer and a surface of the second N-type gallium nitride layer; and extending the transparent electrode to a non-light-emitting region, and forming a welding point on the transparent electrode in the non-light-emitting region.

Figure 11:
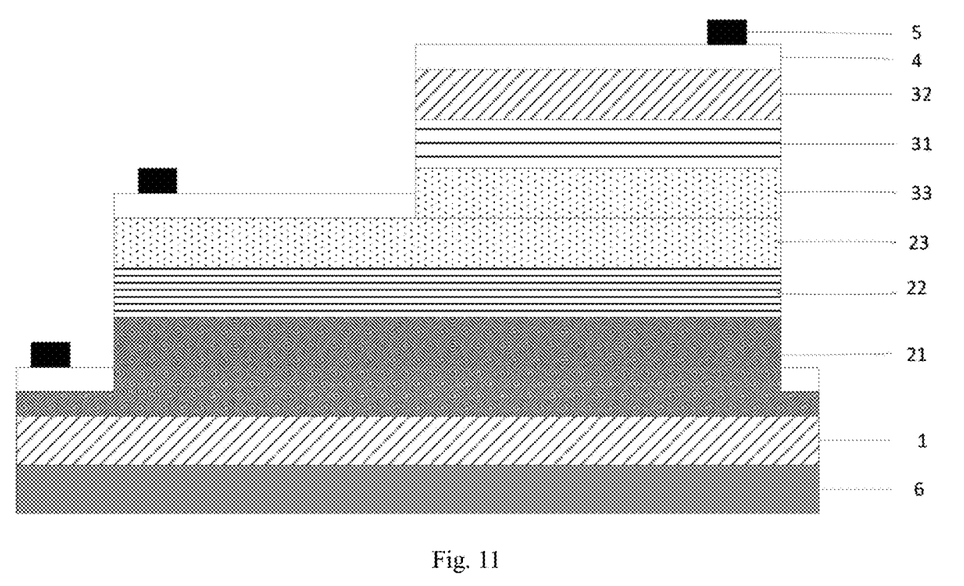

In one example, the forming the welding point on the transparent electrode in the non-light-emitting region specifically includes: forming a silicon nitride layer on the transparent electrode in the non-light-emitting region; forming a welding point on the silicon nitride layer; extending the transparent electrode to a non-light-emitting region, and forming a welding point 5 on the transparent electrode in the non-light-emitting region. See FIG. 11 for details of the structure formed.

In one example, the forming the welding point 5 on the transparent electrode in the non-light-emitting region includes: forming a silicon nitride layer on the transparent electrode in the non-light-emitting region; and forming a welding point 5 on the silicon nitride layer.

S10: peeling the substrate.

An embodiment of the present disclosure further discloses a display substrate, including a backplane and the inorganic light-emitting diode chip described in the above technical solution.

The present disclosure realizes the simultaneous transfer of light-emitting units emitting different colors of light, thereby greatly reducing the number of transfer, and improving the success rate of transfer.

The description of the above Examples is merely used for helping to understand the method according to the present disclosure and its core idea. It should be noted that a person skilled in the art may make further improvements and modifications to the disclosure without departing from the principle of the present disclosure, and these improvements and modifications shall also fall within the scope of the present disclosure.

The above description of the disclosed Examples allows one skilled in the art to implement or use the present disclosure. Various modifications to these Examples would be apparent to one skilled in the art, and the general principles defined herein may be applied to other Examples without departing from the spirit or scope of the disclosure. Therefore, the present disclosure will not be limited to the Examples shown herein, but should conform to the widest scope consistent with the principles and novel features disclosed herein.

What is claimed is:

1. An inorganic light-emitting diode chip, comprising an undoped gallium nitride layer and a light-emitting unit arranged on the undoped gallium nitride layer,
    wherein the light-emitting unit comprises a first light-emitting subunit and a second light-emitting subunit, the first light-emitting subunit comprises a first N-type gallium nitride layer, a first multi-quantum well layer and a first P-type gallium nitride layer that are sequentially arranged, and the second light-emitting subunit comprising a second P-type gallium nitride layer, a second multi-quantum well layer and a second N-type gallium nitride layer that are sequentially arranged on a surface of the first P-type gallium nitride layer,
    wherein an orthogonal projection of the second multi-quantum well layer on the undoped gallium nitride layer is smaller than an orthogonal projection of the first multi-quantum well layer on the undoped gallium nitride layer, and
    wherein a color of a light beam emitted by the second multi-quantum well layer is different from a color of a light beam emitted by the first multi-quantum well layer, and
    wherein the second P-type gallium nitride layer is arranged between the first P-type gallium nitride layer and the second multi-quantum well layer, and the second multi-quantum well layer completely covers the second P-type gallium nitride layer, wherein a transparent electrode is arranged on the second N-type gallium nitride layer and on a portion of a surface of the first P-type gallium nitride layer not covered by the second multi-quantum well layer, and the transparent electrode extends to a non-light-emitting region, and a welding point is arranged on the transparent electrode located in the non-light-emitting region, wherein the first N-type gallium nitride layer comprises a region covered by the first multi-quantum well layer and an uncovered region, and a transparent electrode is arranged on the uncovered region, and the transparent electrode extends to the non-light-emitting region, and welding point is arranged on the transparent electrode in the nonlight-emitting region.

2. The inorganic light-emitting diode chip of claim 1, wherein the first multi-quantum well layer is a green light multi-quantum well layer, and the second multi-quantum well layer is a blue light multi-quantum well layer.

3. The inorganic light-emitting diode chip of claim 2, wherein a doping concentration of indium in the green light multi-quantum well layer is $6.64 \times 10^{-6}$ mol/cm$^3$ to $7.14 \times 10^{-6}$ mol/cm$^3$, and a doping concentration of indium in the blue light multi-quantum well layer is $4.98 \times 10^{-6}$ mol/cm$^3$ to $5.81 \times 10^{-6}$ mol/cm$^3$.

4. The inorganic light-emitting diode chip of claim 1, wherein a silicon nitride layer is arranged between the transparent electrode and the welding point.

5. The inorganic light-emitting diode chip of claim 1, wherein an area of the orthogonal projection of the second multi-quantum well layer on the undoped gallium nitride layer accounts for 40% to 60% of an area of the orthogonal projection of the first multi-quantum well layer on the undoped gallium nitride layer.

6. The inorganic light-emitting diode chip of claim 1, wherein a thickness of the first multi-quantum well layer is 5 nm to 20 nm, and a thickness of the second multi-quantum well layer is 5 nm to 20 nm.

7. A method for preparing an inorganic light-emitting diode chip, comprising:
    forming an undoped gallium nitride layer;
    sequentially forming a first N-type gallium nitride layer, a first multi-quantum well layer and a first P-type gallium nitride layer on the undoped gallium nitride layer;
    etching the first N-type gallium nitride layer, the first multi-quantum well layer and the first P-type gallium nitride layer to form a first light-emitting subunit;
    sequentially forming a second P-type gallium nitride layer and a second multi-quantum well layer on a surface of the first P-type gallium nitride layer, wherein a color of a light beam emitted by the second multi-quantum well layer is different from a color of a light beam emitted by the first multi-quantum well layer, and an orthogonal projection of the second multi-quantum well layer on the undoped gallium nitride layer is smaller than an orthogonal projection of the first multi-quantum well layer on the undoped gallium nitride layer;
    forming a second N-type gallium nitride layer on a surface of the second multi-quantum well layer; and
    etching the second multi-quantum well layer and the second N-type gallium nitride layer to form a second light-emitting subunit, wherein the method further comprising: after forming the first light-emitting subunit, depositing a silicon dioxide layer on the surface of the first P-type gallium nitride layer, etching the silicon dioxide layer to remove the silicon dioxide layer in a first region, so as to expose the first P-type gallium nitride layer in the first region, and forming the second multi-quantum well layer in the first region and the method further comprising after forming the second light-emitting subunit, removing the silicon dioxide layer located outside the first region, and forming a transparent electrode on an exposed surface of the first P-type gallium nitride layer, wherein the transparent electrode extends to a non-light-emitting region, and forming a welding point on the transparent electrode in the non-light-emitting region.

8. The method of claim 7, wherein the forming the second multi-quantum well layer in the first region comprises:
    forming a second P-type gallium nitride layer in the first region; and
    forming a second multi-quantum well layer on a surface of the second P-type gallium nitride layer.

9. The method of claim 7, further comprising: after forming the second light-emitting subunit, forming a transparent electrode on a surface of a region of the first N-type gallium nitride layer not covered by the first multi-quantum well layer and a surface of the second N-type gallium nitride layer, wherein the transparent electrode extends to a non-light-emitting region; and forming a welding point on the transparent electrode in the non-light-emitting region.

10. The method of claim 9, wherein the forming the welding point on the transparent electrode in the non-light-emitting region comprises:

forming a silicon nitride layer on the transparent electrode in the non-light-emitting region; and forming the welding point on the silicon nitride layer.

11. A display substrate, comprising a backplane and the inorganic light-emitting diode chip of claim 1.

12. The inorganic light-emitting diode chip of claim 1, wherein the first multi-quantum well layer is a blue light multi-quantum well layer, and the second multi-quantum well layer is a green light multi-quantum well layer.

13. The inorganic light-emitting diode chip of claim 1, wherein a silicon nitride layer is arranged between the transparent electrode and the welding point.

14. The method of claim 10, wherein the forming the welding point on the transparent electrode in the non-light-emitting region comprises:

forming a silicon nitride layer on the transparent electrode in the non-light-emitting region; and forming the welding point on the silicon nitride layer.

* * * * *

UNITED STATES PATENT AND TRADEMARK OFFICE
CERTIFICATE OF CORRECTION

| | |
|---|---|
| PATENT NO. | : 11,522,101 B2 |
| APPLICATION NO. | : 16/767050 |
| DATED | : December 6, 2022 |
| INVENTOR(S) | : Guoqiang Wang |

It is certified that error appears in the above-identified patent and that said Letters Patent is hereby corrected as shown below:

On the Title Page

In item (73) Assignee, change "BOE Technology Group Co., Ltd." to --Beijing BOE Technology Development Co., Ltd.--.

Signed and Sealed this
Twenty-eighth Day of March, 2023

Katherine Kelly Vidal
*Director of the United States Patent and Trademark Office*